United States Patent
Chi et al.

(10) Patent No.: US 12,188,982 B2
(45) Date of Patent: Jan. 7, 2025

(54) TEST METHOD FOR DELAY CIRCUIT AND TEST CIRCUITRY

(71) Applicant: REALTEK SEMICONDUCTOR CORP., Hsinchu (TW)

(72) Inventors: Kuo-Wei Chi, Hsinchu (TW); Chun-Chi Yu, Hsinchu (TW); Chih-Wei Chang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 163 days.

(21) Appl. No.: 17/860,216

(22) Filed: Jul. 8, 2022

(65) Prior Publication Data

US 2023/0011710 A1    Jan. 12, 2023

(30) Foreign Application Priority Data

Jul. 12, 2021   (TW) .................. 110125417

(51) Int. Cl.
| | |
|---|---|
| *G01R 31/317* | (2006.01) |
| *H03K 3/037* | (2006.01) |
| *H03K 5/00* | (2006.01) |
| *H03K 21/08* | (2006.01) |

(52) U.S. Cl.
CPC ....... *G01R 31/31727* (2013.01); *H03K 3/037* (2013.01); *H03K 5/00* (2013.01); *H03K 21/08* (2013.01); *H03K 2005/00019* (2013.01)

(58) Field of Classification Search
CPC ........ G01R 31/31727; G01R 31/31725; G01R 31/2856; H03K 3/037; H03K 5/00; H03K 21/08; H03K 2005/00019; H03K 5/131
See application file for complete search history.

(56) References Cited

U.S. PATENT DOCUMENTS

| | | | | |
|---|---|---|---|---|
| 5,192,886 | A * | 3/1993 | Wetlaufer | G11C 19/28 327/158 |
| 6,499,334 | B1 | 12/2002 | Kobayashi | |
| 6,665,230 | B1 * | 12/2003 | Shrader | H03K 5/133 365/194 |
| 2011/0074385 | A1 * | 3/2011 | Sunaga | G01R 31/3016 324/76.11 |
| 2011/0116330 | A1 | 5/2011 | Kim et al. | |
| 2018/0364752 | A1 * | 12/2018 | Li | H03K 5/1565 |
| 2019/0041440 | A1 * | 2/2019 | Duggal | G01R 23/15 |

* cited by examiner

*Primary Examiner* — Akm Zakaria

(74) *Attorney, Agent, or Firm* — Li & Cai Intellectual Property (USA) Office

(57) ABSTRACT

A test method for a delay circuit and a test circuitry are provided. The test circuitry incudes the delay circuit that essentially includes multiple serially connected logic gates, a clock pulse generator at an input end of the delay circuit for generating one or more cycles of clock signals, and a counter at an output end of the delay circuit for counting the clock signals passing through the delay circuit. The test circuitry implements a test mode by switching lines to the clock pulse generator and the counter. The test circuitry relies on a comparison result of a counting result made by the counter and a number of the cycles of the clock signals to test any failure of the delay circuit.

14 Claims, 5 Drawing Sheets

TEST METHOD FOR DELAY CIRCUIT AND TEST CIRCUITRY

CROSS-REFERENCE TO RELATED PATENT APPLICATION

This application claims the benefit of priority to Taiwan Patent Application No. 110125417, filed on Jul. 12, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a test technology for a delay circuit, and more particularly to a test method and a test circuitry that is able to conduct high-speed test on a delay chain circuit by adding an additional circuit.

BACKGROUND OF THE DISCLOSURE

Defects may be formed on a wafer in an IC (integrated circuit) manufacturing process. The defective products should be discarded during a mass production process by an overall test performed on the ICs. In general, the test can be categorized into a design for testability (DFT), a scan test and a functional test. The scan test is to conduct an overall scan to the integrated circuit with a test pattern and clock signals generated by a design for testability utility software. The scan test can be classified into a low-speed test and a high-speed test. The high-speed test is also known as an at-speed test. The scan test can be processed before the circuit is packaged. The functional test is used to test a specific function in the integrated circuit. The functional test can be a read-write test performed on a double data rate synchronous dynamic random access memory (DDR SDRAM) after the circuit is packaged.

A delay chain circuit can be used in an integrated circuit in one of the test methods. One of the objectives of the delay chain circuit is to control signal delay. FIG. 1 is a schematic block diagram of a delay chain circuit. Input signals 101 are inputted to the delay chain circuit and form output signals 102 through a plurality of delay cells 11, 12 and 13 in the delay chain circuit. Each of the delay cells can be implemented by an assembly of logic gates. The logic gate can be formed by combining two NAND gates, as shown in the diagram.

A delay control circuit 100 is connected with the plurality of delay cells 11, 12 and 13 via multiple logic gates such as NAND gates, respectively. The delay control circuit 100 controls a delay series via switching signals inputted to the logic gates. In other words, the switching signals determine the number of the delay cells that the input signals 101 pass through.

Reference is made to FIG. 2, which is a schematic diagram depicting an exemplary example of a delay chain circuit. A test circuitry and a circuit under test of the delay chain circuit can be packaged into one circuit element, such as an integrated circuit. The circuit element performs a built-in self-test that embodies a design for testability. When a clock signal 201 is received externally by the integrated circuit, a delay chain circuit 20 adjusts a series of the delay cells and determines a duration that the clock signal 201 is to be delayed according to a delay phase control signal 23. The delayed clock signal is inputted to one or more flip flops 21 formed by logic gates. The flip flop 21 samples an input data 203 according to the clock signal. A sampled data 205 is therefore formed, and provided for follow-up testing.

The clock signals in the integrated circuit can be high-speed (e.g., 800 MHz) signals during the sampling process, and the scan test of the design for testability is also required to be able to test 800 MHz signals. However, the scan test of the design for testability can only be a low-speed (e.g., 100 MHz) test since an overall time delay is long due to many delay cells (e.g., delay cells 11, 12, and 13 of FIG. 1) being used in the delay chain circuit 20. In practice, there is a gap between the above-mentioned scan test and an actual clock rate of the integrated circuit, which causes the test to be incomplete.

Although a high-speed test can be applied to the delay chain circuit during a functional test process, a general functional test may encounter problems, for example, the functional test cannot be performed on all of the delay cells of the delay chain circuit effectively, the functional test is time-consuming, or the cost of packaging may be wasted if any defect is found in the functional test process after packaging.

SUMMARY OF THE DISCLOSURE

In response to the above-referenced inadequacies that the conventional delay chain circuit cannot proceed with a high-speed test due to a long overall delay caused by a plurality of delay cells, a test method for a delay circuit and a test circuitry are provided in the present disclosure. One of the approaches is to insert an additional clock pulse generator and a counter in a test circuitry for performing the high-speed test on the entirety of delay circuit under a test mode.

In an aspect of the disclosure, the test circuitry embodies a test mode used to test a delay chain circuit through a newly-added clock pulse generator and a counter.

The delay circuit is an assembly of multiple serially connected logic gates, which are configured to decide a plurality of delay series according to a delay phase control signal. The clock pulse generator is disposed at an input end of the delay circuit, and is used to generate one or more cycles of the clock signals that are configured to be inputted to the delay circuit. The counter is disposed at an output end of the delay circuit, and is used to count the one or more cycles of the clock signals that are delayed by the delay circuit. Afterwards, the test circuitry tests whether or not the delay circuit fails by comparing a counting result with the number of cycles of the clock signals generated by the clock pulse generator.

Further, the delay circuit can be a self-test circuitry built in an integrated circuit. The input end of the delay circuit has a first switching circuit that is used to switch a source of the clock signals to an input circuit originally used to input the clock signals to the delay circuit according to a control signal, or to a newly-added clock pulse generator. The output end of the delay circuit has a second switching circuit that is used to switch the delay circuit to data generated by a circuit under test or to the counter according to the control signal.

The counter is connected with an output circuit that is used to receive the one or more cycles of the clock signals delayed by the delay circuit via the second switching circuit. The output circuit includes a flip flop that is configured to record the one or more cycles of the clock signals generated by the clock pulse generator.

When the test circuitry operates under the test mode, a delay control circuit is used to adjust the delay series of the delay circuit to a maximum that allows the one or more cycles of the clock signals to be outputted through all the delay cells of the delay circuit.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
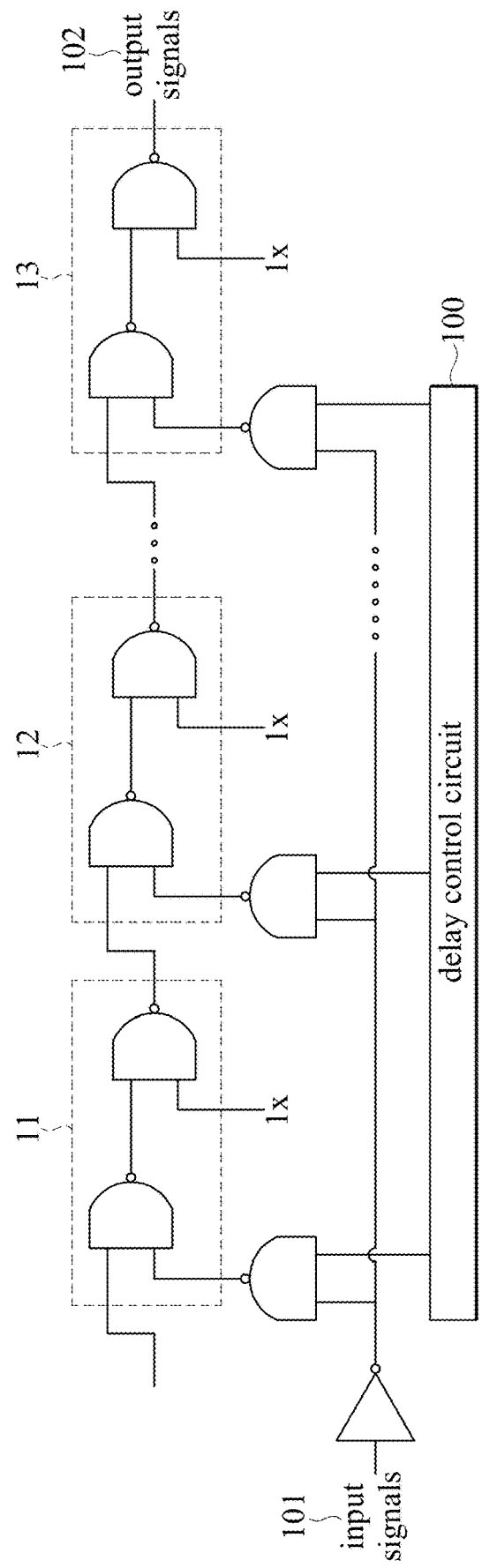
FIG. 1 is a schematic diagram of a delay chain circuit.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

A test method for delay circuit and a test circuitry are provided in the present disclosure to solve the problem that an integrated circuit such as a double data rate synchronous dynamic random access memory (DDR SDRAM) cannot be tested at a practical high-speed operating frequency (e.g., 800 MHz, or DDR at GHz level) when using a conventional delay circuit (i.e., a delay chain circuit), and can only be tested at a lower operating frequency. One of the objectives of the test method is to perform an at-speed test on a circuit under test with the delay chain circuit, especially a high-speed test. It should be noted that the test may not be sufficient if only low-speed test is done by the delay circuit because some production defects on the integrated circuits can only be found at a high-speed test.

The test can include a scan test and a function test. The scan test includes a high-speed test and a low-speed test. The high-speed test can be interpreted as a test having a speed that approaches the operating frequency of a circuit under test such as a high-speed DDR memory. The test circuitry includes a delay chain circuit. Multiple delay cells in the delay chain circuit can be flip flops. The delay chain circuit decides delay series by phase control. The greater the delay series are, the delay cells required are more and the longer the delay is. The high-speed test may therefore not be tested completely. More particularly, the provided test method for delay circuit and the test circuitry are applied to a wafer-level test, which is the test performed before packaging.

Figure 3:
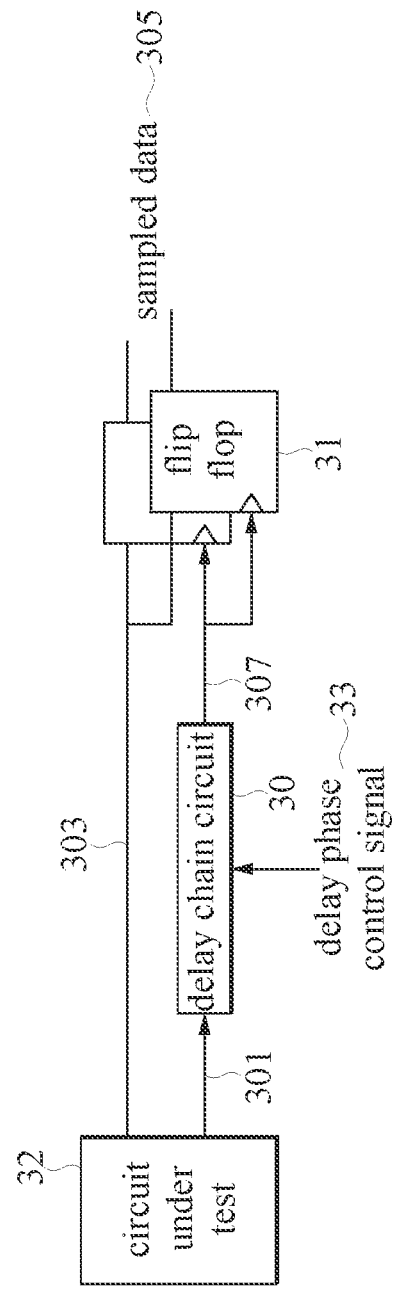
FIG. 3 is a schematic diagram depicting an example of a high-speed circuit adopting the delay chain circuit.

Reference is made to FIG. 3, which shows an example of a delay chain circuit that is applied to a high-speed circuit. In the present example, data 303 generated by a circuit under test 32 is transmitted to a flip flop 31 at an output end. The circuit under test 32 generates clock signals 301 that are transmitted to a delay chain circuit 30. The delay chain circuit 30 decides delay series according to a delay phase control signal 33 generated by a delay control circuit. Afterwards, delayed clock signals 307 are generated. The flip flop 31 performs sampling according to the delayed clock signals 307 so as to generate sampled data 305.

In an exemplary example, the circuit under test 32 is such as a DDR SDRAM. The circuit under test 32 includes multiple pins that include a data-selection pulse pin (DQS) pin. The DQS pin is used to accurately distinguish every cycle within a clock cycle and then output clock signals 301 periodically.

The clock signals 301 are then transmitted to the delay chain circuit 30 for controlling the clock signals 301 to be delayed. The delayed clock signals 307 are then outputted to the flip flop 31. A data signal pin (DQ) is also provided. A read-write sequence of the DQ pin is synchronized with the clock signals generated by the data-selection pulse, and therefore the DQ pin outputs the data 303 that is synchronized with the clock signals. The flip flop 31 then samples the delayed clock signals 307, and the sampled data 305 is obtained. The sampled data 305 can be used to test and ensure the quality of the circuit under test 32.

Figure 2:
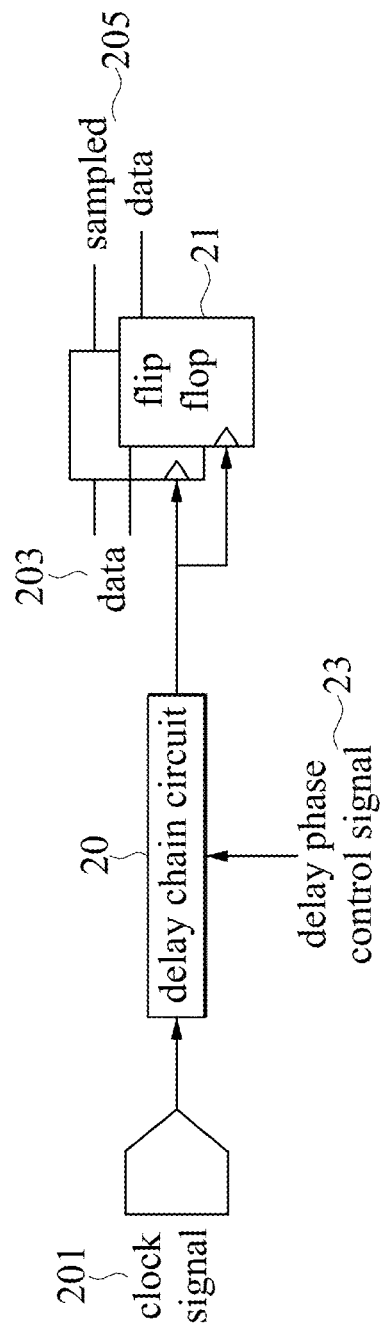
FIG. 2 is a schematic diagram depicting an example of the delay chain circuit.

It should be noted that the conventional test circuitry can only test the delay circuit in a lower frequency, and therefore the test may not be complete since the conventional test circuitry cannot test the circuit (e.g., the integrated circuit) under a practical operating frequency when too many delay series are configured on the delay chain circuit that is used to control the delay of the circuit under test. Accordingly, the test circuitry of the present disclosure used to control the delay incorporates some additional circuits such as a clock pulse generator and a counter. The test circuitry embodies a test mode that can test a high-frequency circuit through a switching circuit. Referring to FIG. 2, the switching circuit can switch a line to the conventional delay chain circuit for the test circuitry to operate a function mode.

Figure 4:
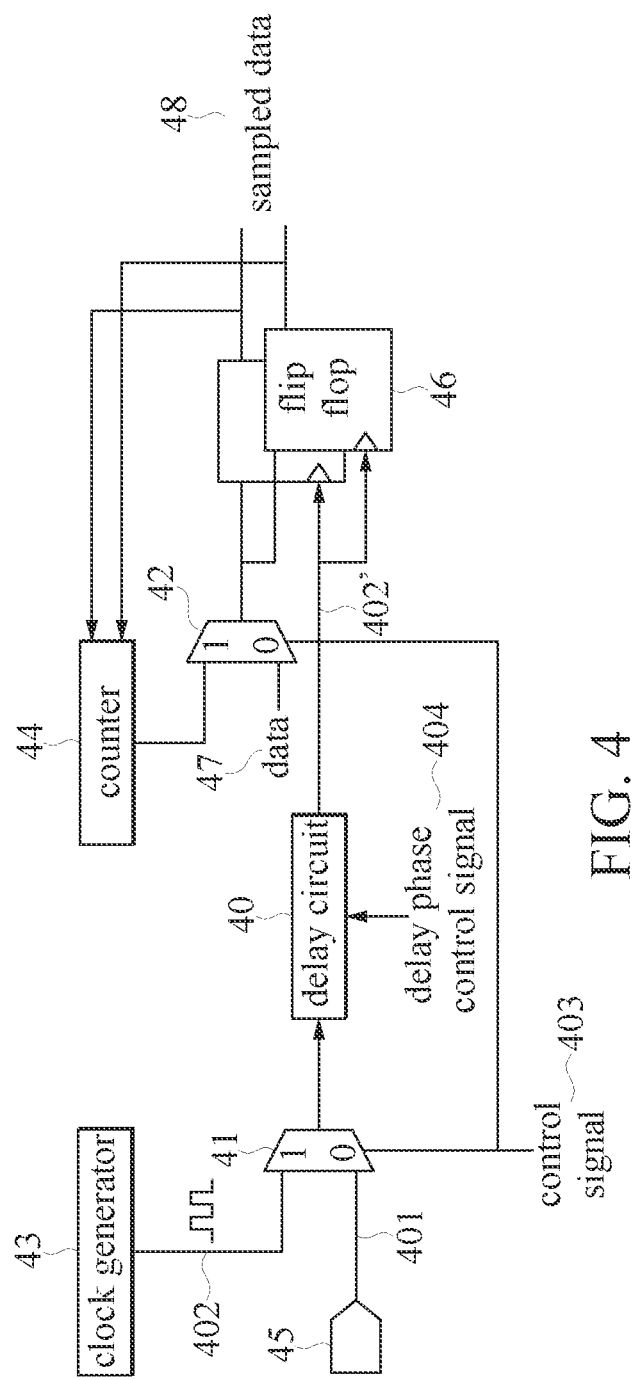
FIG. 4 is a block diagram of a test circuitry that operates a test method for a delay circuit according to one embodiment of the present disclosure.

Reference is made to FIG. 4, which is a schematic diagram depicting a test circuitry that performs the test method for a delay circuit. The test circuitry includes a delay circuit 40. The delay circuit 40 provides a delay function by combining multiple serially connected logic gates. More specifically, a series of flip flops, D-type flip-flops (DFF), or NAND gates form the delay chain circuit. The D-type flip-flops turn the clock signals from a high level to a low level for outputting data inputted to a D-end of the flip flop via a Q-end of the flip flop. This process takes up certain amounts of time and therefore a delay effect is provided.

According to one embodiment of the test circuitry, a first switching circuit 41 is disposed at an input end of the delay circuit 40. The first switching circuit 41 can be implemented by a selector or a multiplexer. The first switching circuit 41 switches the sources of the clock signals according to a control signal 403 (1 or 0) generated by a control circuit (not shown in the diagram). For example, the original function mode operated by the circuit under test is maintained if the control signal is 0; on the contrary, the test circuitry is under the test mode if the control signal is 1. Under the test mode, an external control circuit (not shown in the diagram) generates a delay phase control signal 404 for deciding delay series specified to the delay circuit 40. The first switching circuit 41 switches an input circuit 45 that is originally used to input a first clock signal 401 to the delay circuit 40 to a newly-added clock pulse generator 43. The clock pulse generator 43 is disposed at the input end of the delay circuit 40, and is used to generate one or more cycles of clock signals that is called second clock signal 402 in this embodiment. The second clock signal 402 is characterized by having a frequency that is similar to or higher than the operating frequency of the circuit under test (not shown in the diagram). The second clock signal 402 configured to be inputted to the delay circuit 40 can be the clock pulses with two or more cycles. Under the test mode, the clock pulse generator 43 generates the second clock signals 402 for testing the delay circuit 40. The second clock signals 402 are outputted to an output circuit via the delay circuit 40. The output circuit includes one or more flip flops 46. The number of the flip flops used in the output circuit is designed to be able to record the number of cycles of the second clock signals 402 generated by the clock pulse generator 43. For example, the number of the flip flops can be two.

The output end of the delay circuit 40 includes a second switching circuit 42. The second switching circuit 42 can be implemented by a selector or a multiplexer, in which one end of the second switching circuit 42 is connected with a counter 44, and the other end of the second switching circuit 42 is used to receive practical test data 47. The test data 47 is generated by the circuit under test. An output end of the second switching circuit 42 is connected with a flip flop 46. Under the test mode, the second switching circuit 42 is synchronized with the first switching circuit 41. The second switching circuit 42 switches the line to the counter 44 according to a control signal 403, and the counter 44 is triggered by a clock signal so as to obtain a counting result from the one or more flip flops 46.

Further, under the test mode, the one or more flip flops 46 receives delayed second clock signals 402' which are delayed by the delay circuit 40. The number of the flip flops 46 of the output circuit is decided according to the number of pulse cycles of the second clock signals 402. The delayed second clock signals 402' trigger the counter 44 disposed at the output end of the delay circuit 40 so as to start counting. The counter 44 counts the delayed second clock signals 402'. Under the test mode, sampled data 48 outputted from the output circuit is the counting result. The counting result is compared with the number of the clock signals generated by the clock pulse generator 43 in the beginning, such that the quality of the delay circuit 40 can be tested.

The flip flop 46 in the output circuit can be a D-type flip-flop. The delay circuit 40 delays the second clock signals 402 with two or more cycles of pulse clock and then outputs the delayed second clock signals 402' to the certain number of the flip flops which are able to record the number of cycles of the second clock signals 402. The counter 44 relies on values (0 or 1) of the flip flops to conduct the counting. The counting result can be recorded in the one or more flip flops. The counting result is compared with the number of cycles of the clock signals generated by the clock pulse generator 43 so as to test if any error occurred to the delay circuit 40.

Figure 5:
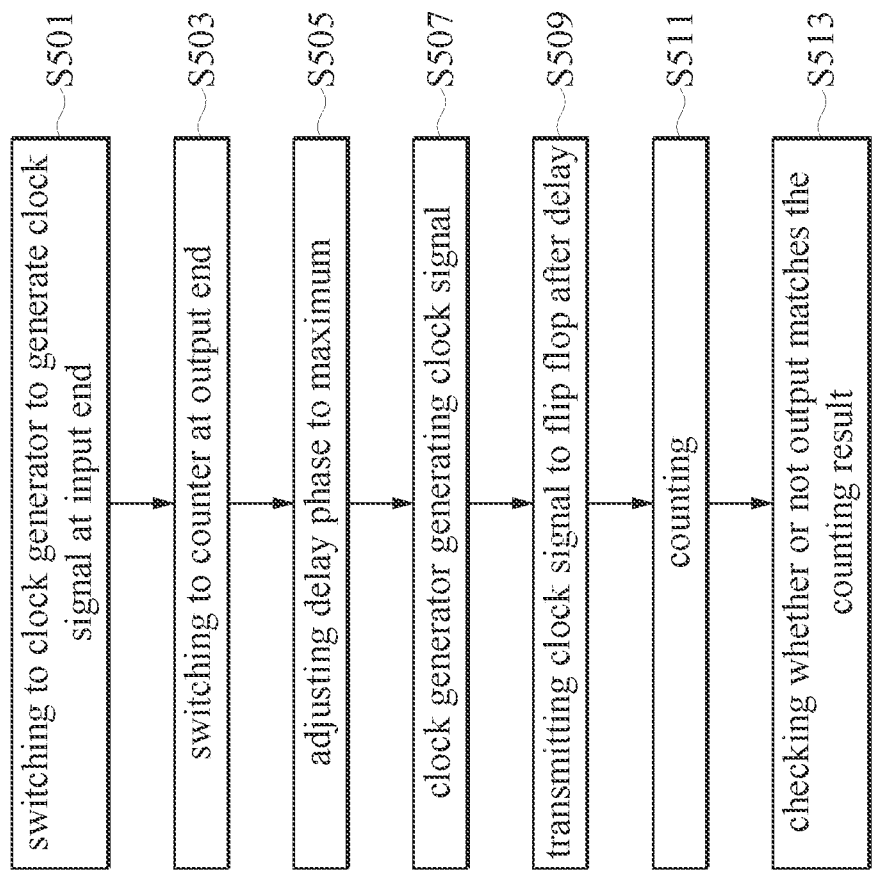
FIG. 5 is a flowchart describing an operating process of the test method for the delay circuit according to one embodiment of the present disclosure.

Reference is made to FIG. 5, which is a flow chart describing a test method for a delay circuit that can be implemented by the delay chain circuit shown in FIG. 4 according to the present disclosure.

When the test circuitry operates under the test mode, the first switching circuit at the input end of the delay circuit switches the line to the newly-added clock pulse generator so as to generate multiple cycles of clock signals (step S501). Under the test mode, the second switching circuit at the output end of the delay circuit switches the line to the counter from an original line used to receive data (step S503). The delay control circuit of the test circuitry is used to adjust a delay phase to a maximum. Practically, the input signals, i.e., the clock signals, are inputted to all the delay cells of the delay circuit before being outputted (step S505). An initial state of the test circuitry is to keep a logic value of the clock pulse generator to be "0", and a logic value of the flip flop at the output end is also kept to be "0". An internal register can be used to keep a control signal that is used to control the first switching circuit and the second switching circuit to conduct line switching. The register can be disposed inside the delay control circuit. When the delay circuit is to be tested, a control signal is generated to enable the delay circuit to enter a test mode.

Afterwards, under the test mode, the clock pulse generator generates two or more clock signals, which is a type of pulse signal with a specific pulse width. The pulse width can be the same as a practical clock cycle of the circuit under test (step S507). The clock signals are inputted to the delay circuit, and transmitted to the output end of the delay circuit through all the delay cells of the delay circuit. The output circuit includes one or more flip flops. The number of the flip flops can be decided according to the number of the pulse signals to be transmitted at the input end (S509). The clock signal triggers the counter to operate and the counter counts the number of cycles of the clock signals (step S511). A counting result can be obtained in the output circuit. The counting result in the output circuit is compared with the number of cycles of the clock signals at the input end of the delay circuit so as to check if the counting result meets the number of cycles of the clock signals (step S513).

In an exemplary example, when the clock pulse generator generates two pulses, the pulses trigger a counter to start counting and a counting result is 2. At the same time, an output value of the output circuit is also 2. Accordingly, the delay circuit is determined to have no defect. The output circuit is such as a flip flop that can be a negative edge triggered D-type flip-flop. The delay circuit can be determined to have any defect or not by checking whether or not the output of the D-type flip-flop is 2 by using the above-mentioned method. Therefore, a built-in self-test is embodied in the circuit under test if the circuit passes the test.

In summation, in a design for testability of an integrated circuit, a test circuitry is implanted in the integrated circuit at a design stage such that a self-testing can be performed after production. The self-test can be used to ensure that the electronic element has no defect in its function or in the manufacturing process. In the test method for delay circuit and the test circuitry according to the present disclosure, the circuits such as a clock pulse generator and a counter are added in the test circuitry for implementing a test mode. A high-speed test for the delay circuit can be completed under the test mode. Therefore, test completeness of the subsequent circuit under test can be improved. The circuit under test such as a wafer-level circuit can be processed with a chip probing (CP) test before a packaging process for implementing a complete test in order to ensure the quality of the circuit made in mass production.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A test method for a delay circuit, which is operated in a test circuitry under a test mode, the test method comprising:
   generating, by a clock pulse generator, one or more cycles of clock signals, wherein, a first switching circuit disposed at an input end of the delay circuit is used to switch a line to the clock pulse generator for generating the one or more cycles of the clock signals;
   inputting the one or more cycles of the clock signals to the delay circuit that outputs delayed clock signals to one or more flip flops of the delay circuit, wherein the one or more flip flops are disposed at an output end of the delay circuit, and a quantity of the flip flops enables recording of the one or more cycles of the clock signals generated by the clock pulse generator;
   under the test mode, a second switching circuit disposed at the output end of the delay circuit switching a line to a counter for enabling a counter to count the delayed clock signals; and
   comparing a counting result of the counter with a number of cycles of the clock signals so as to determine whether the delay circuit fails.

2. The test method according to claim 1, wherein the delay circuit controls a delay series according to a delay phase control signal.

3. The test method according to claim 1, wherein, under the test mode, the clock pulse generator generates the clock signals having a pulse width being same as a clock cycle of a circuit under test.

4. The test method according to claim 1, wherein the counter is triggered by the delayed clock signal to operate.

5. The test method according to claim 4, wherein the delay circuit controls a delay series according to a delay phase control signal.

6. The test method according to claim 5, wherein, under the test mode, a delay control circuit is used to adjust the delay series of the delay circuit to a maximum, which enables the one or more cycles of the clock signals to be outputted through all delay cells of the delay circuit.

7. A test circuitry, comprising:
   a delay circuit;
   a clock pulse generator disposed at an input end of the delay circuit and used to generate one or more cycles of clock signals to be inputted to the delay circuit, wherein the one or more cycles of the clock signals has a same or higher operating frequency as an operating frequency of a circuit under test connected with the delay circuit;
   a first switching circuit being disposed at the input end of the delay circuit, wherein the first switching circuit switches a source of the clock signals to an input circuit originally used to input the clock signals to the delay circuit, or switches the source of the clock signals to the clock pulse generator according to a control signal;
   a counter disposed at an output end of the delay circuit and used to count the one or more cycles of the clock signals delayed by the delay circuit; and
   a second switching circuit being disposed at the output end of the delay circuit, wherein, under a test mode, the second switching circuit is used to switch a line to receive data generated by the circuit under test or the counter according to the control signal;
   wherein, to determine whether or not the delay circuit fails, a counting result of the counter is compared with a number of the one or more cycles of the clock signals generated by the clock pulse generator.

8. The test circuitry according to claim 7, wherein the test circuitry operates under the test mode, and a delay control circuit is used to adjust a delay series of the delay circuit to a maximum, which enables the one or more cycles of clock signals to be outputted through all delay cells of the delay circuit.

9. The test circuitry according to claim 7, wherein the delay circuit is an assembly of multiple serially connected logic gates, which are configured to decide a delay series according to a delay phase control signal.

10. The test circuitry according to claim 7, wherein the circuit under test is an integrated circuit that is packaged together with the test circuitry into a circuit element for performing a built-in self-test.

11. The test circuitry according to claim 10, wherein the test circuitry operates under the test mode, and a delay control circuit is used to adjust a delay series of the delay circuit to a maximum, which enables the one or more cycles of clock signals to be outputted through all delay cells of the delay circuit.

12. The test circuitry according to claim 7, wherein the counter is connected with an output circuit used to receive the one or more cycles of the clock signals delayed by the delay circuit via the second switching circuit, and the output circuit includes a flip flop which is used to record a number of the one or more cycles of the clock signals generated by the clock pulse generator.

13. The test circuitry according to claim 12, wherein the counter is triggered by the delayed clock signal to operate.

14. The test circuitry according to claim 13, wherein the test circuitry operates under the test mode, and a delay control circuit is used to adjust a delay series of the delay circuit to a maximum, which enables the one or more cycles of clock signals to be outputted through all delay cells of the delay circuit.

\* \* \* \* \*